United States Patent [19]
Platzer et al.

[11] Patent Number: 5,900,345
[45] Date of Patent: May 4, 1999

[54] SURFACTANT IN PRECOAT FOR LITHOGRAPHIC PLATES

[75] Inventors: Stephan J. W. Platzer, Longmeadow; Joe E. South, Holyoke; Melinda A. Alden, Chicopee, all of Mass.

[73] Assignee: Kodak Polychrome Graphics, LLC, Norwalk, Conn.

[21] Appl. No.: 08/944,303

[22] Filed: Oct. 6, 1997

[51] Int. Cl.$^6$ ............................. G03C 1/93; G03F 7/021
[52] U.S. Cl. ..................... 430/156; 430/155; 430/157; 430/158; 430/166; 430/271.1
[58] Field of Search ........................... 430/272.1, 278.1, 430/157, 159, 166, 156, 160; 428/483

[56] References Cited

U.S. PATENT DOCUMENTS

| | | | |
|---|---|---|---|
| 3,860,426 | 1/1975 | Cunningham et al. | 96/86 |
| 4,631,245 | 12/1986 | Pawlowski | 430/175 |
| 4,640,886 | 2/1987 | Miller et al. | 430/271 |
| 4,983,497 | 1/1991 | Gilson et al. | 430/272 |
| 5,328,797 | 7/1994 | Neubauer et al. | 430/169 |
| 5,543,261 | 8/1996 | Vermeersch et al. | 430/159 |
| 5,543,262 | 8/1996 | Sypek et al. | 430/162 |
| 5,637,435 | 6/1997 | Shimizu | 430/156 |
| 5,639,586 | 6/1997 | Hauquier et al. | 430/159 |

*Primary Examiner*—Kathleen Duda
*Assistant Examiner*—Jill N. Hackathorn
*Attorney, Agent, or Firm*—Ratner & Prestia

[57] ABSTRACT

Improved aluminum substrates suitable for use in the production of lithographic printing plates. A surfactant surface treatment for such aluminum substrates improves the quality of radiation sensitive coatings subsequently applied to the substrate. The surfactant may be in a layer comprising a mixture of a hydrophilizing composition and a surfactant on the aluminum alloy surface; or a hydrophilizing layer comprising a hydrophilizing composition may be on the aluminum alloy surface and a surfactant layer comprising a surfactant on the hydrophilizing layer.

18 Claims, No Drawings

SURFACTANT IN PRECOAT FOR LITHOGRAPHIC PLATES

BACKGROUND OF THE INVENTION

1. Field of the Invention

The present invention relates to aluminum substrates suitable for use in the production of lithographic printing plates. More particularly, the invention pertains to a surfactant surface treatment for such aluminum substrates which improves the quality of radiation sensitive coatings subsequently applied to the substrate.

2. Description of the Prior Art

It has long been known to form printing plates by coating a lithographically suitable radiation sensitive composition onto the surface of an aluminum sheet substrate with subsequent imagewise exposure to radiation and development. Oleophilic image areas which remain after development accept and transfer ink during the printing process and the hydrophilic non-image areas accept water or aqueous solutions during printing to repel such greasy inks.

Typically the substrate comprises an aluminum alloy and the surface of the substrate has been pretreated before coating the radiation sensitive composition with one or more processes such as cleaning, degreasing, chemical etching, mechanical graining, electrochemical graining, anodizing and/or hydrophilizing. Each of these pretreatment steps contributes to forming a high quality printing plate by providing advantageous surface characteristics such as surface uniformity, adhesion to image areas, removal of non-image areas, length of printing run, surface hardness and differentiation between ink accepting and ink repelling areas.

In order to prepare a high quality printing plate, it is important that a very uniform radiation sensitive coating be applied to an underlying hydrophilic surface. Achieving such a uniform coating has been somewhat of a problem in the art and the resulting plates may show a somewhat irregular mottled or non-heterogeneous appearance. It has been found that this is a result of poor wetting of the radiation sensitive coating to the underlying hydrophilic surface. It has now been unexpectedly found that when a surfactant is included in the composition of an underlying layer, the applied radiation sensitive coating is substantially uniform and non-mottled in appearance.

SUMMARY OF THE INVENTION

The invention provides an image forming article which comprises
(a) a substrate having a surface which comprises an aluminum alloy;
(b) a material on the aluminum alloy surface, which material comprises (i) or (ii):
  i) a layer comprising a mixture of a hydrophilizing composition and a surfactant on the aluminum alloy surface; or
  ii) a hydrophilizing layer comprising a hydrophilizing composition on the aluminum alloy surface and a surfactant layer comprising a surfactant on the hydrophilizing layer; and
(c) a substantially uniform layer of an image forming composition directly on the material (b).

The invention also provides a method of producing an image forming article which comprises applying a substrate having a surface which comprises an aluminum alloy with a material on the aluminum alloy surface, which material comprises (i) or (ii):

i) a layer comprising a mixture of a hydrophilizing composition and a surfactant on the aluminum alloy surface; or
ii) a hydrophilizing layer comprising a hydrophilizing composition on the aluminum alloy surface and a surfactant layer comprising a surfactant on the hydrophilizing layer; and applying and drying a substantially uniform layer of an image forming composition directly on the material.

The invention further provides an article which comprises
(a) a substrate having a surface which comprises an aluminum alloy;
(b) a material on the aluminum alloy surface, which material comprises (i) or (ii):
  i) a layer comprising a mixture of a hydrophilizing composition and a surfactant on the aluminum alloy surface; or
  ii) a hydrophilizing layer comprising a hydrophilizing composition on the aluminum alloy surface and a surfactant layer comprising a surfactant on the hydrophilizing layer.

DETAILED DESCRIPTION OF THE PREFERRED EMBODIMENT

The substrates which may be employed in the practice of this invention include those which have a surface comprising an aluminum alloy. The most preferred substrate is composed of aluminum and the alloys thereof especially those aluminum compositions suitable for the manufacture of lithographic printing plates such as Aluminum Association alloys 1050, 1100, 3003 and A-19. The thickness of the aluminum sheets are well known for such purposes, for example those which are from 0.004 inches to 0.025 inches in thickness, however, the exact choice of aluminum sheet may be left to the discretion of the skilled worker. Other suitable substrates include sheets of other materials which have an aluminum coating thereon such as aluminized plastic sheets.

The aluminum surface may be smooth or roughened and may or may not have been pre-treated by standard techniques as are well known in the art. Standard metal substrate pre-treatments include cleaning or degreasing of milling oils, surface roughening by chemical etching, electrochemical or mechanical graining and anodizing by methods which are known to the skilled worker. The surface roughness and topography varies with each of these processes.

Preferably the aluminum alloy surface is first cleaned or degreased of milling oils. Cleaning or degreasing may be accomplished by a wide range of solvent or aqueous alkaline treatments. Typical alkaline degreasing treatments include contacting with hot aqueous solutions containing alkalis such as sodium hydroxide, potassium hydroxide, trisodium phosphate, sodium silicate, aqueous alkaline and surface active agents. Less preferred due to environmental and health considerations are solvent degreasing agents such as trichloroethylene, 1,1,1-trichloroethane, and perchloroethylene. Degreasing is accomplished by immersion, spray or vapor washing of the substrate with the degreasing agent.

For best results, the cleaned surface should be chemically etched to remove aerial oxide. Such etching can be accomplished by known etching means including immersion in acidic or alkaline baths followed by rinsing. In one preferred embodiment, chemical etching is done by immersing the sheet into an aqueous bath containing a phosphoric acid/chromic acid solution, or hydrochloric acid and/or nitric acid baths. The etchant is preferably present in an amount of up to about 25% by weight of the bath composition, more preferably from about 5% to about 18% and most preferably from about 7% to about 12%; The bath is preferably maintained at a temperature of from about 10° C. to about 95° C., more preferably from about 20° C. to about 80° C. and most preferably from about 25° C. to about 60° C. The immersion is preferably conducted for a time ranging from about 5 seconds to about 3 minutes. Longer times can be used but are not practical since excess aluminum continues to dissolve. A more preferable immersion time ranges from about 20–120 seconds and most preferably from about 40 to about 80 seconds. After etching it is preferable that the aluminum surface should be rinsed with water while still wet with etchant solution.

If the surface of the aluminum substrate is grained, either mechanically, for example by use of wire brushes or particulate slurries, or electrochemically by use of electrolytic solutions of acids, the printing life of a plate may be substantially extended. Mechanical graining may be done by dry abrasion of the aluminum surface with metal brushes, wet abrasion with brushes and slurries of abrasive particles such as pumice, and ball graining. Such techniques are well known in the art. There are some drawbacks to mechanical graining, namely, the formed surface topography is directional in nature which affects printing quality and ink-water balance. Also, the surface is contaminated with microscopic abrasive particles. Furthermore, the slurry graining conditions continuously change. As brushes are used they become shorter. As the slurry is used it loses abrasivity, thus requiring replenishment with fresh material. The aluminum surface purity is a function of graining time due to a continual build-up of $Al(OH)_3$, $Al_2O_3$, and particulate aluminum. All this results in a surface fluctuating in quality.

Electrolytic graining of aluminum and the electrolytic process has many advantages over mechanical graining. A very fine and even grain is achievable. In electrochemical graining, the surface area is greatly expanded thus providing superior lithographic characteristics. However, although the surface is uniform and has a large surface area, it is relatively flat. This leads to poor draw-down of a printing plate in a vacuum frame which results in halation, and poor water carrying capabilities thereby resulting in difficulties in maintaining a wide latitude for the ink/water balance when printing. Both can have disadvantageous consequences in quality printing. The above disadvantages can be alleviated by conducting a mechanical graining step followed by electrochemical graining to provide a superimposed electrochemical grain on the mechanically grained surface.

Electrolytically graining the aluminum may be done in an aqueous electrolytic solution containing nitric acid and/or hydrochloric acid. The optimum concentrations of the hydrochloric acid and nitric acid will depend upon such factors as the current density employed, the temperature of the electrolyte solution, and the properties of the aluminum article being grained. A fine and even grain can be obtained in an electrolyte consisting of an aqueous solution of hydrochloric acid, but the current density employed must be kept quite low or pitting of the aluminum surface will take place and, as a result of the low current density, a relatively long period is required to complete the graining. The optimum parameters can be readily determined by a few simple experiments. Electrolytic graining of aluminum sheets with hydrochloric or nitric acids is well known in the art as shown by U.S. Pat. Nos. 3,980,539; 3,072,546; 3,073,765; 3,085,950; 3,935,080; 3,963,594 and 4,052,275, among others. Optionally, the electrolytic solution may also contain oxalic acid, aluminum nitrate, aluminum chloride, or hydrogen peroxide, as described in U.S. Pat. No. 4,336,113; boric acid as described in U.S. Pat. No. 4,374,710 or any of a plethora of other additives known in the art of electrochemical graining. U.S. Pat. No. 4,242,417 teaches a method of graining the surface of an aluminum sheet substrate which comprises first subjecting the substrate to a mechanical graining treatment such as using a wire brush or wet slurry and then etching in a saturated aqueous solution of an aluminum salt of a mineral acid to which optionally up to 10 percent of a mineral acid may be added.

The preferred concentration of nitric acid in the electrochemical graining step, ranges from about 3 g/l to about 20 g/l; more preferably 8 g/l to about 20 g/l; most preferably 10 g/l to about 15 g/l. Above about 20 grams per liter, no significant etching difference is noted until about 500 g/l is reached, at which point etching power begins to decrease. The preferred concentration of hydrochloric acid in the electrochemical graining step, ranges from about 3 g/l to about 100 g/l; more preferably about 5 g/l to about 60 g/l; most preferably about 8 g/l to 15 g/l. The preferred concentration of oxalic acid when it is used, ranges from about 1 gram per liter to about 80 grams per liter, more preferably about 5 to 45 grams per liter, most preferably about 8 to 20 grams per liter. The preferred concentration of hydrogen peroxide, when it is used, ranges from about 1 g/l to about 60 g/l; more preferably about 10 to about 30 g/l; most preferably about 15 to 20 g/l. The preferred concentration of aluminum nitrate when it is used is at about its saturation point, more preferably at about 65 to 70 grams per liter; most preferably 65 grams per liter. The preferred concentration of aluminum chloride when it is used ranges from about 1 g/l to about 10 g/l; more preferably about 1 to about 8 g/l; most preferably about 1 to about 5 g/l. The preferred concentration of boric acid when it is used ranges from about 1 g/l to about the saturation point, more preferably about 5 to 15 grams per liter, most preferably about 8 to 12 grams per liter. Preferably, the electrolytic current density employed in the graining step ranges from about 30 to about 120 amps/square decimeter, more preferably about 45 to about 80 $a/dm^2$, most preferably about 45 to 60 $a/dm^2$. The preferred electrolysis time ranges from about 20 seconds to about 3 minutes, more preferably 20 seconds to about 90 seconds, most preferably 20 seconds to about 60 seconds. Graining is preferably conducted with alternating current. When alternating current is used, a frequency in excess of 50 Hz produces the best graining effect. A frequency of from about 60 to about 300 Hz is most preferred.

After cleaning and graining, if desired, the metal may optionally be anodized to harden the surface. This may be performed by passing the sheet through an aqueous anodizing bath containing, for example, sulfuric acid or phosphoric acid. The preferred concentration of acid is from about 10 to about 20 weight %. The temperature of the anodizing bath is from about 20° to about 80° C., and best results are obtained if the temperature is from about 20° to about 40° C. Either alternating or direct current may be used for anodizing. Best results are obtained if direct current is impressed on the aluminum sheet in the anodizing bath and the current density is in the range of from about 1 to about 100 amperes per square foot. The preferred current density is from about 10 to about 50 amperes per square foot. The anodizing step can be completed in from about 1 to about 20 minutes but usually this step takes no longer than about 1 to about 2 minutes.

In the production of lithographic printing plates, it is advantageous to subsequently treat the grained and anodized plate with a hydrophilizing layer composition prior to coating with a radiation sensitive composition. These interlayer treatments serve to better adhere the radiation sensitive coating to the substrate and also render the aluminum surface more hydrophilic. The substrate may be treated by spraying, brushing, dipping or other means with a composition suitable for use as a hydrophilizing interlayer for lithographic plates. The result is a surface having an improved capillary wettability which manifests itself in an improved ink-water balance in printing plates produced with this substrate. Typical interlayer treatments comprise an aqueous solutions of a hydrophilizing compound such as alkali silicate, particularly sodium silicate, silicic acid, the Group IV-B metal fluorides, alkali metal salts, polybasic acids such as polyvinyl phosphonic acid and polyacrylic acid, the alkali zirconium fluorides, such as potassium zirconium hexafluoride, and hydrofluozirconic acid. Such techniques are disclosed in U.S. Pat. Nos. 2,946,683 and 3,160,506. The hydrophilizing component is preferably present in concentrations of from about 0.1% to about 20% by weight of the composition. A preferred concentration range is from about 3 to about 8% and the most preferred range is from about 4 to about 5%.

In one embodiment of the invention, the hydrophilizing composition layer is modified and further contains a surfactant. In another embodiment of the invention, a surfactant containing layer is applied to the hydrophilizing layer.

When the surfactant is incorporated into the hydrophilizing layer, it is present in an amount of from about 0.001% to about 10%, more preferably from about 0.001% to about 1% and most preferably from about 0.005% to about 0.1% by weight of the hydrophilizing composition. The balance of the hydrophilizing composition is a solvent such as water. Upon application, the hydrophilizing layer is subsequently dried to a coating weight of from about 0.001 to about 0.2 grams/square meter. A more preferred range is from about 0.005 grams/square meter to about 0.08 grams/square meter and most preferably from about 0.01 grams/square meter to about 0.06 grams/square meter.

In another embodiment of the invention, the surfactant is applied as a separate surfactant containing layer directly on the hydrophilizing layer. When the surfactant is incorporated into a separate surfactant layer composition, it is present in an amount of from about 0.001% to about 10%, more preferably from about 0.001% to about 1% and most preferably from about 0.005% to about 0.1% by weight of the surfactant layer composition. The balance of the surfactant layer is a solvent such as water. Upon application, the surfactant layer is subsequently dried to a coating weight of from about 0.0005 to about 0.1 grams/square meter. A more preferred range is from about 0.001 grams/square meter to about 0.04 grams/square meter and most preferably from about 0.001 grams/square meter to about 0.02 grams/square meter. In another embodiment, one may employ both a hydrophilizing layer containing a surfactant and a second separate surfactant layer.

Suitable surfactants useful within the context of the present invention may include compounds which are also known as defoaming, antifoaming, air release, antiblocking, wetting, anticratering, leveling, or flow agents. They may be selected from the general chemical groups of hydrocarbons, polyethers, fluorocarbons, and silicones. Non-exclusive examples of hydrocarbons include fatty esters, ethoxylated fatty esters, stearamides, laurates, sorbitan oleates, and acetylenic glycols. Non-exclusive examples of polyethers are polypropylene oxides, polyethylene oxides, copolymers of ethylene oxide and propylene oxide, polyvinyl ethers, and alkylaryl polyethers. Non-exclusive examples of flurocarbons are lithium fluoroalkyl carboxylates, ammonium fluoroalkyl phosphates, ammonium fluoroalkyl sulfates, aminotrimethylene perfluorooctanamides, and fluoroalkyl polyesters. Non-exclusive examples of silicones are polymethylalkylsiloxanes, polydimethylsiloxanes, polyether modifed polydimethylsiloxanes, polytrifluaropropylmethyl siloxanes, and siloxane glycol copolymers. The most preferred surfactants for use in the present invention are selected from the fluorocarbon and silicone groups.

Suitable surfactants may have reactive groups, such as primary hydroxyl groups and/or double bonds for crosslinking reactions. Suitable surfactants useful within the context of the present invention may be anionic, cationic, nonionic, amphoteric, or mixtures thereof, provided the selected surfactant is compatible with the other ingredients in the layer in which it is employed. Examples of anionic fluorocarbon surfactants are lithium fluoroalkyl carboxylates such as Zonyl FSA from DuPont, ammonium fluoroalkyl phosphates such as Zonyl FSP, and ammonium fluoroalkyl sulfates such as Fluorad FC-120 from 3M. Examples of cationic fluorocarbon surfactants are Zonyl FSD and Fluorad FC-135. Examples of nonionic fluorocarbon surfactants are Zonyl FSN, FSN-100, FSO, FSO-100, Fluorad FC-170C, FC-430, FC-43 1, and FC-740.

Optionally, the hydrophilizing layer or surfactant layer may include other ingredients such as one or more of the hereinafter described radiation sensitive compositions, most particularly diazonium compounds. When a radiation sensitive composition is incorporated into the hydrophilizing and/or surfactant layer composition, it is present in an amount of from about 0.01% to about 10%, more preferably from about 0.05% to about 1% and most preferably from about 0.1% to about 0.5% by weight of the hydrophilizing and/or surfactant layer composition.

Lithographically suitable, image forming, radiation sensitive compositions typically comprise light sensitive, aromatic diazonium salts, o-quinone diazides and photopolymerizable compositions which are a combination of a photopolymerizable compound and a photoinitiator as are well known in the art. These are typically admixed with binding resins to extend the number of copies which a plate may reproduce.

Suitable photopolymerizable compounds contain at least two olefinically unsaturated double bonds. Such are well known in the art. Suitable for use as polymerizable compounds are ethers, esters and partial esters of acrylic and methacrylic acid and aromatic and aliphatic polyols containing preferably 2 to 30 carbon atoms, or cycloaliphatic polyols containing preferably 5 or 6 ring carbon atoms. These polyols can also be modified with epoxides such as ethylene oxide or propylene oxide. The partial esters and esters of polyoxyalkylene glycols are also suitable. Examples are ethylene glycol dimethacrylate, diethylene glycol dimethacrylate triethylene glycol dimethacrylate, tetraethylene glycol dimethacrylate, polyethylene glycol dimethacrylates having an average molecular weight in the range from 200 to 2000, ethylene glycol diacrylate, diethylene glycol diacrylate, triethylene glycol diacrylate, tetraethylene glycol diacrylate, polyethylene glycol diacrylates having an average molecular weight in the range from 200 to 2000, trimethylolpropane ethoxylate trimethacrylate, trimethylolpropane polyethoxylate trimethacrylates having an average molecular weight in the range from 500 to 1500, trimethylolpropane ethoxylate triacrylates having an average molecular weight in the range from 500 to 1500, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethylacrylate, 1,3-butanediol dimethacrylate, sorbitol triacrylate, sorbitol tetraacrylate, sorbitol tetramethacrylate, sorbitol pentaacrylate, sorbitol hexaacrylate, oligoester acrylates, oligoester methacrylates, glycerol di- and triacrylate, 1,4-cyclohexane diacrylate, bisacrylates and bismethacrylates of polyethylene glycols having an average molecular weight from 100 to 1500, ethylene glycol diallyl ether, 1,1,1-trimethylolpropane triallyl ether, pentaerythritol triallyl ether, diallyl succinates and diallyl adipates or mixtures of the above compounds. Preferred multifunctional acrylate oligomers include, but are not limited to acrylated epoxies such as Interez Corporation's Novacure 3701, acrylated polyurethanes such as Sartomer Co.'s C9505, and acrylated polyesters such as Henkel Corp.'s Photomer 5007. Preferred photopolymerizable polymers include, but are not limited to acrylamido substituted cellulose acetate butyrate and cellulose acetate proprionate available from Bomar; acrylated epoxies available from Echo Resins; acrylated polyesters; acrylated polyethers and acrylated urethanes. A preferred photopolymerizable polymer is Jaylink 106E which is an acrylamido modified cellulose acetate butyrate polymer manufactured by Bomar Specialties. Such are described in U.S. Pat. Nos. 4,557,951 and 4,490,516 which are incorporated herein by reference. These describe a polymerizable cellulosic ester or ether product capable of homopolymerization or co-polymerization with vinyl monomers. They have a degree of substitution of between 2.0 and 2.9 reacted with an acrylamide reactant containing a methylol group to provide a degree of substitution of from about 0.05 to about 0.5 and to provide a degree of hydroxyl substitution of from about 0.05 to about 0.5. Another preferred photopolymerizable compound is Sartomer 9041 which is a pentaacrylate ester manufactured by Sartomer. The photopolymerizable compound is present in an amount sufficient to photopolymerize upon exposure to sufficient actinic radiation. In the preferred embodiment, the multifunctional photopolymerizable compound is present in the overall composition in an amount of from about 1% to about 80% by weight, preferably from about 20% to about 70% based on the non-solvent parts of the overall radiation sensitive composition.

When photopolymerizable compositions are used they contain at least one free radical generating component which photolytically generates free radicals. Examples of free radical generating components include photoinitiators which themselves photolytically generate free radicals by a fragmentation or Norrish type 1 mechanism. These latter have a carbon-carbonyl bond capable of cleavage at such bond to form two radicals, at least one of which is capable of photoinitiation. Suitable initiators include aromatic ketones such as benzophenone, acrylated benzophenone, 2-ethylanthraquinone, phenanthraquinone, 2-tert-butylanthraquinone, 1,2-benzanthraquinone, 2,3-benzanthraquinone, 2,3-dichloronaphthoquinone, benzyl dimethyl ketal and other aromatic ketones, e.g. benzoin, benzoin ethers such as benzoin methyl ether, benzoin ethyl ether, benzoin isobutyl ether and benzoin phenyl ether, methyl benzoin, ethyl benzoin and other benzoins; diphenyl-2,4,6-trimethyl benzoylphosphine oxide; and bis(pentafluorophenyl)titanocene.

The free radical generating component may comprise a combination of radical generating initiators which generate free radicals by a Norrish type 1 mechanism and a spectral sensitizer. Such a combination includes 2-methyl-1-4'-(methylthio]-2-morpholinopropiophenone available from Ciba Geigy as Irgacure 907 in combination with ethyl Michler's ketone (EMK) which is 4,4'-bisdiethylaminobenzophenone; Irgacure 907 in combination with 2-isopropylthioxanthanone (ITX); benzophenone in combination with EMK; benzophenone in combination with ITX; 2-benzyl-2-N, N-dimethylamino-1-(4-morpholinophenyl)-1-butanone which is available from Ciba-Geigy as Irgacure 369 in combination with EMK; Irgacure 369 in combination with ITX. In such cases, it is preferred that the weight ratio of radical generating photoinitiator and spectral sensitizer ranges from about 5:1 to about 1:5.

Other radical generators useful for this invention non-exclusively include triazines, such as chlorine radical generators such as 2-substituted-4,6-bis(trihalomethyl)-1,3,5-triazines. The foregoing substitution is with a chromophore group that imparts spectral sensitivity to the triazine to a portion of the electromagnetic radiation spectrum. Non-exclusive examples of these radical generators include 2-(4-methoxynaphth-1-yl)-4,6-bis(trichloromethyl)-1,3,5,-triazine which is available commercially from PCAS, Longjumeau Cedex (France) as Triazine B; 2-(4-methylthiophenyl)-4,6-bis(trichloromethyl)-1,3,5,triazine; 2-(4-methoxystyryl)-4,6-bis(trichloromethyl)-1,3,5-triazine; 2-(4-diethylaminophenyl-1,3-butadienyl)-4,6-bis(trichloromethyl)-1,3,5-triazine, among others. Also useful for the invention are Norrish type II mechanism compounds such as combinations of thioxanthones such as ITX and a source of abstractable hydrogen such as triethanolamine.

The free radical generating component is present in an amount sufficient to effect photopolymerization of the photopolymerizable compound upon exposure to sufficient actinic radiation. The photoinitiator may comprise from about 1% to about 50% of the non-solvent parts of the overall composition, or more preferably from about 2% to about 40% and most preferably from about 5% to about 25%.

Preferably the composition further comprises at least one compound selected from the group consisting of benzanthrone, substituted benzanthrone, phenanthrenequinone and substituted phenanthrenequinone wherein the substitutions may be with one or more halogen atoms, alkyl groups having 1 to about 5 carbon atoms, and alkoxy groups having 1 to about 5 carbon atoms. Unsubstituted benzanthrone is most preferred. The benzanthrone or substituted benzanthrone, phenanthrenequinone or substituted phenanthrenequinone compound is present in an amount sufficient to substantially prevent photopolymerization of the photopolymerizable compound when the light sensitive composition is exposed to actinic radiation below a threshold amount but to permit photopolymerization of the photopolymerizable compound when the light sensitive composition is exposed to actinic radiation above the threshold amount. The benzanthrone, substituted benzanthrone, phenanthrenequinone or substituted phenanthrenequinone may comprise from about 0.1% to about 15% by weight of the non-solvent parts of the overall composition, or more preferably from about 0.5% to about 10% and most preferably from about 1% to about 5%.

Light sensitive diazonium compounds suitable for use in the present invention include light sensitive diazonium polymers. Such diazonium polymers are well known to the skilled artisan and may be formed by condensing a diazonium monomer with a condensing agent in an acidic medium and isolating the condensation product with an anion. Suitable diazonium compounds include those condensed with formaldehyde such as disclosed in U.S. Pat. Nos. 2,063,631 and 2,667,415, the polycondensation products such as disclosed in U.S. Pat. Nos. 3,849,392 and 3,867,147, and the high photo-speed and co-condensed diazos such as disclosed in U.S. Pat. Nos. 4,436,804 and U.S. 4,533,620. A useful diazonium is the polycondensation product of 3-methoxy-4-diazo-diphenyl amine sulfate and 4,4'-bismethoxy-methyl-diphenyl ether, precipitated as the mesitylene sulfonate, such as is taught in U.S. Pat. No. 3,849,392 and which is incorporated herein by reference. Typical diazo compounds are disclosed on pages 194–214 and 321–330 of the volume "Light Sensitive Systems" by Jaromir Kosar, John Wiley & Sons, Inc., New York, 1965. Suitable light sensitive diazonium polymers are isolated as the salts of the condensation product of a suitable monomeric diazonium or mixture of monomeric diazoniums with a suitable condensing agent and which condensed in strong acid. Examples of suitable monomeric diazoniums include but are not limited to p-diazodiphenylamine sulfate; 3-methoxy-4-diazodiphenylamine sulfate; 4-diazo-4'-methoxydiphenylamine sulfate; 2,5-diethoxy-4-diazo-4'-thiotolyl sulfate and combinations thereof. Examples of suitable condensing agents include but are not limited to formaldehyde; paraformaldehyde; 4,4-bismethoxymethyldiphenylether; 4,4-bishydroxymethyldiphenylether; 4,4'-bismethoxymethyldiphenylsulfide; 4,4'-bismethoxymethyl bisphenol A and combinations thereof Examples of suitable condensing acids include but are not limited to sulfuric acid, phosphoric acid, trifluoromethyl sulfonic acid and nitric acid. Examples of suitable salt anions used to isolate the condensation products include but are not limited to p-toluenesulfonate, hexafluorophosphate, tetrafluoroboride, mesitylenesulfonate, and trifluoromethlysulfonate. The most preferred diazonium compound is DSO-19 which is the condensation product of 4-diazodiphenylaminesulfate and formaldehyde isolated as the p-toluenesulfonate and is manufactured by PCAS. The diazonium polymer, when one is used, is present in an amount sufficient to form a light sensitive composition which is substantially sensitive to actinic radiation in the range of from about 300 to about 550 nm. The diazonium compound preferably may comprise from about 0.5% to about 25% of the non-solvent parts of the overall composition, or more preferably from about 1% to about 15% and most preferably from about 5% to about 10%.

In another embodiment of the invention, the radiation sensitive compound may comprise a positive working o-quinone diazide radiation sensitizer. These sensitizers which comprise a component of the compositions of the present invention are preferably selected from the group of substituted o-naphthoquinone diazide sensitizers which are conventionally used in the art in positive photolithographic formulations. Suitable compounds include the o-quinone-4- or-5-sulfonyl-diazides. Such sensitizing compounds are disclosed in U.S. Pat. Nos. 2,797,213; 3,106,465; 3,148,983; 3,130,047; 3,201,329; 3,785,825; and 3,802,885, which are incorporated herein by reference. The o-quinone diazides are well known to the skilled artisan as demonstrated by Light Sensitive Systems, Kosar, J.; John Wiley & Sons, New York, 1965 in Chapter 7.4 which is also incorporated herein by reference. It presently appears that the number of fused rings is not important for this invention but the position of the sulfonyl group is important. That is, one may use benzoquinones, naphthoquinones or anthroquinones, preferably the oxygen is in the 1 position, diazo is in the 2 position and the sulfonyl group is in the 4 position. Likewise the phenolic member to which it is attached does not appear to be important. For example it can be a cumylphenol derivative as taught in U.S. Pat. No. 3,640,992 or it can be a mono-, di-, or tri-hydroxyphenyl alkyl ketone or benzophenone as shown in U.S. Pat. No. 4,499,171 which are incorporated herein by reference. Useful radiation sensitizers for the present invention also include an ester of 2,3,4,4'-tetrahydroxybenzophenone, having on the average, from about 60 mol percent to about 100 mol percent of the hydroxy groups of the 2,3,4,4'-tetrahydroxybenzophenone having been esterified by 1,2-naphthoquinonediazide-5-sulfonic acid. This compound is not new in and of itself Its production is described in U.S. Pat. Nos. 3,106,465, and 4,719,167 which are incorporated herein by reference. Preferred radiation sensitive components are 1,2-naphthoquinone diazide-4 or 5-sulfonic acid esters such as a trihydroxybenzophenone-1,2-naphthoquinone diazide-4 or 5-sulfonic acid trisester. The diazide component is preferably present in an amount of from about 5% to about 30% by weight of the composition, more preferably from about 8% to about 25% and most preferably from about 10% to about 15%.

In the preferred embodiment, the composition may also contain a polymeric binder to bind the other components into a substantially uniform mixture which can be applied to a substrate. Examples of suitable binders non-exclusively include gelatin, polyvinyl alcohol, polyvinylalcohol copolymers, polyvinyl butyral, acrylic ester polymers and copolymers; polyacrylic acid, polymethacrylic acid, polyethylene oxide, ethylcellulose, polyesters, polystyrene, polyacrylic acid esters, polymethacrylic acid esters, polyvinyl acetal, polyamides, polyacrylonitrile, polyethylene halogenated polyolefins, chlorinated rubber ethylcellulose, cellulose acetate, cellulose nitrate and other homopolymers; and copolymers prepared from various kind of vinyl compounds such as polyvinylacetate and copolymers of polyvinylacetate, polyvinylchloride and copolymers; polyvinylidene chloride polymers and copolymers; vinyl chloride-vinyl acetate copolymer, and styrene-butadiene copolymer.

When o-quinone diazides are used, preferred binding resins include a water insoluble, aqueous alkaline soluble or swellable binding resin, which is preferably a novolak. The production of novolak resins is well known in the art. A procedure for their manufacture is described in *Chemistry and Application of Phenolic Resins,* Knop A. and Scheib, W.; Springer Verlag, New York, 1979 in Chapter 4 which is incorporated herein by reference. Suitable novolak resins employed by this invention are water insoluble, aqueous alkali soluble resins having a preferred molecular weight in the range of from about 6,000 to about 14,000, or more preferably from about 8,000 to about 12,000.

The amount of the binder can be experimentally varied by one skilled in the art depending on the desired product characteristics, however they typically comprise from about 1 to about 50% and preferably from about 5 to about 30% of the overall composition by weight.

Colorants, such as dyes and organic and inorganic pigments are commonly used to impart color to the radiation sensitive coating. Color is a desired characteristic of a photosensitive coating for printing plates. The color allows inspection of the printing plate for coating defects and uniformity of the coating before use. After the plate is imagewise exposed and the unexposed coating is removed by development, color in the exposed coating remaining on the plate provides visible discrimination between exposed, imaged areas of the plate and the unexposed, non-imaged areas of the plates. However care should be taken to avoid certain dyes and pigments known in the art to exert a desensitization effect upon light sensitive compositions.

Useful colorants non-exclusively include dyes such as Rhodamine, Chalcozine, Victoria Blue and methyl violet and pigments such as the anthraquinone and phthalocyanine types. Perylene maroon, phthalo cyanine blue, phthalo cyanine green and cadmium red are similarly useful. Generally, he colorant is in the form of a pigment chip which comprises a mixture of one or more pigments dispersed in a suitable dispersant. The pigment will comprise about 20 to about 80% of the pigment chip, preferably about 40 to about 60%. Examples of suitable dispersants to be used include but are not limited to polyvinylbutyral, polyvinylformal, cellulose esters, polyurethanes and epoxies. The dispersant will comprise 20 to 80% of the pigment dispersion, preferably 40 to 60%. A preferred colorant is 79S26C chip which is a mixtute of 60% phthalocyanine blue pigment (Pigment Blue 15:4) in Monsanto Butvar B-98 (polyvinylbutyral polymer) and is available commercially from Penn Color Inc. The 79S26C chip produces a blue color in the photocoat. Such dispersions are described in U.S. Pat. No. 5,286,594 which is incorporated herein by reference. A suitable amount of the colorant which can be used ranges from about 0.01% to about 25%, preferably 0.1% to 15%, by weight based on the weight of the composition excluding solvents of this invention. Another preferred component is an exposure indicator such as metanil yellow (phenylazodiphenylamine, 4-sulfonic acid sodium salt). This is a pH sensitive dye which produces a dye image in conjunction with the acid produced by the diazonium compound.

The components of the above composition may be combined by mixing them together in a suitable solvent medium. Solvents which can be used in preparing the photopolymerizable composition of this invention include 1,2-dichloroethane, alcohols such as methanol, ethanol, propanol and butanol; ketones such as acetone, methyl ethyl ketone, methyl isobutyl ketone, cyclohexanone, diisobutyl ketone, etc., esters such as ethyl acetate, butyl acetate, amyl acetate, methyl formate, ethyl propionate, dimethyl phthalate, ethyl benzoate and methyl Cellosolve acetate; aromatic hydrocarbons such as toluene, xylene, benzene, ethylbenzene; halogenated hydrocarbons such as carbon tetrachloride, trichloroethylene, chloroform, 1,1,1-trichloroethane, 1,2-dichloroethane, monochlorobenzene, chloronaphthalene; ethers such as tetrahydrofuran, diethyl ethers ethylene glycol monoethyl ether acetate, ethylene glycol monomethyl ether, etc., dimethylformamide, dimethyl sulfoxide, etc., and mixtures thereof. The most preferred solvents are ethyleneglycol monomethylether, ethyleneglycol monoethylether and dimethyl formamide which dissolve the other components of the photographic coating. A suitable amount of the solvent which can be employed in the photopolymerizable composition of this invention ranges from about 50% to about 1,000%, preferably 70% to 500%, by weight of the total non-solvent parts of the composition.

Various optional additives may be added to the composition depending on the purpose of the end-use of the light-sensitive composition, and other various conditions. Examples of these include thermal polymerization inhibitors, plasticizers and others.

Specific examples of suitable thermal polymerization inhibitors include hydroquinone, hydroquinone monomethyl ether, catechol, beta-naphthol, mono-t-butylhydroquinone, pyrogallol, 4-tert-butylphenol, 2,5-di-tert-butylhydroquinone or 2,6-di-tertbutyl-4-methylphenol. A suitable amount of the thermopolymerization inhibitor which can be used ranges from about 0.01% to about 5%, preferably 0.1% to 3%, by weight, based on the weight of the non-solvent parts of the composition.

Examples of suitable plasticizers include dioctyl phthalate, dibutyl phthalate, butyl phthalyl, butyl glycolate, tricresyl, phosphate, polyester series plasticizers and chlorinated paraffins. A suitable amount of the plasticizer can range from about 0.1% to about 20%, preferably 1% to 10%, by weight based on the weight of the non-solvent parts of the composition.

In order to construct the photographic elements of the present invention, the radiation sensitive composition is coated onto the above prepared substrate and dried. The coating is preferably applied to a properly prepared lithographic plate substrate by any well known coating technique and the solvents are evaporated to yield a dry coating weight of from about 0.3 to about 4 $g/m^2$, more preferably from about 0.5 to about 3 $g/m^2$, and most preferably from about 0.6 to about 2 $g/m^2$. The most preferred radiation sensitive composition is that disclosed in U.S. Pat. No. 5,543,262 which is incorporated herein by reference.

The thusly produced photographic element may then be exposed to ultraviolet or actinic radiation, such as in the 300 to 550 nanometer range through a photographic mask and developed. Suitable uv light sources are carbon arc lamps, xenon arc lamps, mercury vapor lamps which may be doped with metal halides (metal halide lamps), fluorescent lamps, argon filament lamps, electronic flash lamps and photographic floodlight lamps. Exposure is conducted to provide sufficient actinic energy to the element to permit a photochemical change in the image areas where the light sensitive composition is exposed through a mask and yet substantially prevent any photochemical change in the nonimage areas. The nonimage areas from an exposed negative working photosensitive layer or the image areas from an exposed positive working photosensitive layer are removed with a suitable developer.

Typical developer compositions can be alkaline or neutral in nature and have a pH range of from about 5 to about 12. Developers are preferably formed from aqueous solutions of phosphates, silicates or metabisulfites. Such non-exclusively include mono-, di- and tri-alkali metal phosphate, sodium silicate, alkali metal metasilicate and alkali metabisulfite. Alkali metal hydroxides may also be used although these are not preferred. The developers may also contain art recognized surfactants, buffers, solvents and other ingredients.

The following non-limiting examples will serve to illustrate the invention. It will be appreciated that variations in proportions and alternatives in elements of the components of the photosensitive coating composition will be apparent to those skilled in the art and are within the scope of the present invention.

EXAMPLE 1

An aluminum lithographic substrate which has been degreased, brush grained, electrochemically etched, desmutted, and anodized is hydrophilized by a silicate treatment. The silicated substrate is coated with an aqueous solution containing a diazo and a surfactant. The diazo is the water soluble, photosensitive condensate of 3-methoxy-4-diazodiphenyl amine with formaldehyde as the half zinc chloride salt. The diazo concentration is 0.4% by weight. The surfactant is BYK 333, which is a polyether modified dimethylpolysiloxane copolymer and is sold by BYK Chemie. The surfactant concentration is 0.01% by weight. The aqueous coating is dried for 1 minute at 70° C. to a coating weight of 0.008 g/m². This diazo coating is overcoated with the following photosensitive, colored solution:

| Component | % by weight |
| --- | --- |
| ethylene glycol methyl ether | 63.13 |
| ethylene glycol ethyl ether | 17.92 |
| dimethyl formamide | 15.45 |
| Sartomer 9041 | 1.10 |
| Estane 5715 | 0.60 |
| metanil yellow | 0.09 |
| Irgacure 907 | 0.49 |
| ethyl Michler's ketone | 0.19 |
| benzanthrone | 0.07 |
| Chip 79S26C | 0.66 |
| DSO-19 | 0.30 |

Sartomer 9041 is a pentaacrylate ester monomer from Sartomer. Estane 5715 is a polyester thermoplastic polyurethane from Goodrich. Irgacure 907 is 2-methyl-4'-(methylthio)-2-morpholinopropiophenone from Ciba Geigy. Chip 79S26C is a colorant of 60% phthalocyanine blue pigment (Pigment Blue 15:4) and 40% polyvinyl butyral (Butvar B-98 from Monsanto). This chip is available from Penn Color. DSO-19 is the condensate of 4-diazodiphenyl amine and formaldehyde as the p-toluene sulfonate salt. This diazo is available from PCAS.

The photosensitive, colored coating is dried for 2 minutes at 70° C. to a coating weight of 0.67 g/m². The dried coating is uniform and without defects. The coating is optimally exposed for 17.5 units and processed with SP plate developer. This developer is neutral (pH=7), contains 10% benzyl alcohol, and is available from Anitec. The plate has a run length of 300,000 impressions.

COMPARATIVE EXAMPLE A

Example 1 is repeated but without the surfactant in the diazo layer. The photosensitive, colored layer is without defects but not uniform. The exposed, processed plate has a run length of 300,000 impressions.

COMPARATIVE EXAMPLE B

Example 1 is repeated but with the surfactant in the photosensitive, colored coating at a concentration of 0.01% by weight. The photosensitive, colored layer is uniform but has voids.

COMPARATIVE EXAMPLE C

Comparative example B is repeated with the surfactant at doubled concentration, namely, 0.02% by weight. The photosensitive, colored layer is uniform but has voids and particles.

EXAMPLE 2

Example 1 is repeated but with the surfactant in both the diazo and photosensitive, colored coatings. The concentration of the surfactant in both coatings is 0.01% by weight. The photosensitive, colored layer is without defects and more uniform than the sample from example 1. The exposed, processed plate has a run length of 300,000 impressions.

EXAMPLE 3

Example 1 is repeated but with a triazine instead of Irgacure 907 and ethyl Michler's ketone. The triazine is 2,4-bis(trichloromethyl)-6-[4-(3-hydroxypropoxy)styryl]-1,3,5-triazine. The photosensitive, colored layer is uniform and without defects. The exposed, processed plate has a run length of 300,000 impressions.

EXAMPLE 4

Example 1 is repeated but with Tego Glide 450 instead of BYK 333. Tego Glide 450 is a polysiloxane polyether copolymer from Tego Chemie. The photosensitive, colored layer is uniform and without defects.

EXAMPLE 5

Example 1 is repeated but with Zonyl FSN-100 instead of BYK 333. Zonyl FSN-100 is a nonionic flurosurfactant from DuPont. The photosensitive, colored layer is uniform and without defects.

EXAMPLE 6

Example 1 is repeated but with Zonyl FSA instead of BYK 333. Zonyl FSA is an anionic flurosurfactant from DuPont. The photosensitive, colored layer is uniform and without defects.

EXAMPLE 7

Example 1 is repeated but with Zonyl FSD instead of BYK 333. Zonyl FSD is a cationic flurosurfactant from DuPont. The photosensitive, colored layer is uniform and without defects.

EXAMPLE 8

A lithographic substrate is prepared as in example 1. The silicated substrate is coated with an aqueous solution containing a surfactant. The surfactant is Fluorad FC-431, which is a nonionic fluoroaliphatic polymeric ester from 3M. The surfactant concentration is 0.01% by weight. The aqueous coating is dried for 1 minute at 70° C. to a coating weight of 0.002 g/m². This surfactant coating is overcoated with the following photosensitive, colored solution:

| Component | % by weight |
| --- | --- |
| ethylene glycol methyl ether | 68.30 |
| ethylene glycol ethyl ether | 15.76 |
| dimethyl formamide | 8.53 |
| Mowital B20H | 2.77 |
| metanil yellow | 0.07 |
| NW 1428 | 1.12 |
| Dispersion 79S26C | 3.45 |

Mowital B20H is a polyvinyl butyral from Hoechst. NW 1428 is the condensate of 3-methoxy-4-diazodiphenylamine with 4,4'-bis(methoxy)diphenyl ether as the mesitylene sulfonate salt. Dispersion 79S26C is a chip of 6:4 phthalocyanine blue pigment (Pigment Blue 15:4)•polyvinyl butyral (Butvar B-98 from Monsanto) at a concentration of 15% by weight in ethylene glycol ethyl ether.

The photosensitive, colored coating is dried for 2 minutes at 70° C. to a coating weight of 0.70 g/m². The dried coating is uniform and without defects. The coating is optimally exposed for 11 units and processed with SP plate developer. The plate has a run length of 500,000 impressions.

EXAMPLE 9

Example 8 is repeated but with Edaplan LA411 instead of FC-431. Edaplan is a modified siloxane glycol copolymer from Muenzing Chemie. This surfactant is used at a concentration of 0.01% in ethylene glycol methyl ether instead of water. The photosensitive, colored layer is extremely uniform and without defects.

COMPARATIVE EXAMPLE D

Example 9 is repeated but with the surfactant in the photosensitive, colored solution. The photosensitive, colored solution is applied directly onto the silicate layer. The dried photosensitive, colored layer is uniform but with voids.

EXAMPLE 10

Example 9 is repeated but with the Mowital B20H modified with p-toluenesulfonyl isocyanate. The photosensitive, colored layer is uniform and without defects. After exposure, the coating is processed with a plate developer which is neutral and contains 5% benzyl alcohol. The plate has a run length of 450,000 impressions.

EXAMPLE 11

Example 9 is repeated but with the Mowital B20H modified with maleic anhydride. The photosensitive, colored layer has a coating weight of 1 g/m$^2$. It is uniform and without defects. After exposure, the coating is processed with ND-143 plate developer from Enco. This developer is basic (pH=8.5) and contains 2-phenoxyethanol, potassium salt of nonanoic acid, trisodium salt of metaphosphoric acid, and sodium dodecylbenzene sulfonate. The plate has a run length of 500,000.

EXAMPLE 12

Example 11 is repeated but with BYK 333 instead of Edaplan LA411. The BYK 333 is used at a concentration of 0.02% by weight in water. This surfactant solution also contains polyvinyl phosphonic acid at a concentration of 0.1% by weight. The lithographic substrate is hydrophilized with this solution at 70° C. The silicate treatment is not needed for this sample. The photosensitive, colored layer is uniform and without defects. The plate has a run length of 600,000.

What is claimed is:

1. An image forming article which comprises:
  (a) a substrate having a surface which comprises an aluminum alloy;
  (b) a material on the aluminum alloy surface, which material comprises a hydrophilizing layer comprising a hydrophilizing composition on the aluminum alloy surface and a surfactant layer comprising a surfactant on the hydrophilizing layer, wherein the hydrophilizing composition is selected from the group consisting of alkali metal silicates, silicic acid, the Group IV-B metal fluorides, polybasic acids, alkali zirconium fluorides, and hydrofluozirconic acid, and wherein the material further comprises a photosensitive member selected from the group consisting of diazonium salts, o-quinone diazides, and photopolymerizable compositions; and
  (c) a substantially uniform layer of an image forming composition directly on the material (b).

2. The article of claim 1 wherein the aluminum alloy surface has been subjected to one or more treatments selected from the group consisting of cleaning, etching, mechanical graining, electrochemical graining and anodizing.

3. The article of claim 1 wherein the hydrophilizing composition is selected from the group consisting of sodium silicates and polyvinyl phosphonic acid.

4. The article of claim 1 wherein the surfactant is selected from the group consisting of anionic, cationic, non-ionic and amphoteric surfactants.

5. The article of claim 1 wherein the surfactant is selected from the group consisting of hydrocarbons, polyethers, fluorocarbons and silicones.

6. The article of claim 1 wherein the image forming composition comprises a photosensitive member selected from the group consisting of diazonium salts, o-quinone diazides, and photopolymerizable compositions.

7. The article of claim 1 wherein the image forming composition comprises a diazonium salt in admixture with a photopolymerizable composition.

8. The article of claim 7 wherein the image forming composition comprises a an admixture of a diazonium compound, a photopolymerizable composition and benzanthrone.

9. The article of claim 8 wherein the image forming composition comprises a binder and a colorant in admixture with the photosensitive member.

10. The article of claim 1 wherein the surfactant layer comprises a photosensitive member selected from the group consisting of diazonium salts, o-quinone diazides, and photopolymerizable compositions.

11. The article of claim 1 wherein the surfactant layer comprises a photosensitive member selected from the group consisting of diazonium salts.

12. The article of claim 1 wherein the material comprises a diazonium salt.

13. The article of claim 1 wherein the hydrophilizing layer composition comprises sodium silicate; the surfactant layer comprises a surfactant selected from the group consisting of fluorocarbons and silicones.

14. The article of claim 13 wherein the surfactant is in admixture with a diazonium compound.

15. The article of claim 14 wherein the image forming composition comprises an admixture of a diazonium compound, a photopolymerizable composition, benzanthrone, a binder and a colorant.

16. The article of claim 15 wherein the photopolymerizable composition comprises one or more photopolymerizable compounds selected from the group consisting of an acrylamido modified cellulose acetate butyrate polymer and a pentaacrylate ester, and a free radical generator which comprises one or more compounds selected from the group consisting of 2-methyl-1-[4-(methylthiophenyl]-2-morpholinopropanone; 2-benzyl-2-N, N-dimethylamino-1-(4-morpholinophenyl)-1-butanone and benzophenone; in combination with one or more compounds selected from the group consisting of 2-isopropylthioxanthanone, 4,4'-bisdiethylaminobenzophenone and a 2-substituted-4,6-bis(trihalomethyl)-1,3,5-triazine wherein the substitution is with a chromophore group.

17. The article of claim 1 wherein the hydrophilizing layer comprises sodium is silicate; the surfactant layer comprises a mixture of a silicone and a diazonium compound; wherein the image forming composition comprises an admixture of a diazonium compound, a photopolymerizable composition, wherein the photopolymerizable composition comprises one or more photopolymerizable compounds selected from the group consisting of an acrylamido modified cellulose acetate butyrate polymer and a pentaacrylate ester, and a free radical generator which is a 2-substituted-4,6 -bis(trihalomethyl)-1,3,5-triazine wherein the substitution is with a chromophore group; benzanthrone; a binder and a colorant.

18. A method of producing an image forming article which comprises applying a substrate having a surface which comprises an aluminum alloy with a material on the aluminum alloy surface, which material comprises a hydrophilizing layer comprising a hydrophilizing composition on the aluminum alloy surface and a surfactant layer comprising a surfactant on the hydrophilizing layer, wherein the hydrophilizing composition is selected from the group consisting of alkali metal silicates, silicic acid, the Group IV-B metal fluorides, polybasic acids, alkali zirconium fluorides, and hydrofluozirconic acid, and wherein the material further comprises a photosensitive member selected from the group consisting of diazonium salts, o-quinone diazides, and photopolymerizable compositions; and applying and drying a substantially uniform layer of an image forming composition directly on the material.

* * * * *